United States Patent
Shin et al.

(10) Patent No.: US 9,822,929 B2
(45) Date of Patent: Nov. 21, 2017

(54) INACTIVE GAS SUPPLY FACILITY AND INACTIVE GAS SUPPLY METHOD

(71) Applicant: Daifuku Co., Ltd., Osaka-shi (JP)

(72) Inventors: Takeshi Shin, Gamo-gun (JP); Tadashi Nishikawa, Gamo-gun (JP); Masahiro Takahara, Gamo-gun (JP); Toshihito Ueda, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 485 days.

(21) Appl. No.: 14/308,039

(22) Filed: Jun. 18, 2014

(65) Prior Publication Data

US 2015/0000785 A1   Jan. 1, 2015

(30) Foreign Application Priority Data

Jun. 26, 2013 (JP) .................................. 2013-134271

(51) Int. Cl.
| | | |
|---|---|---|
| *F17C 5/00* | (2006.01) | |
| *B08B 9/08* | (2006.01) | |
| *H01L 21/673* | (2006.01) | |
| *H01L 21/677* | (2006.01) | |

(52) U.S. Cl.
CPC ............... *F17C 5/007* (2013.01); *B08B 9/08* (2013.01); *H01L 21/67393* (2013.01); *H01L 21/67769* (2013.01); *F17C 2227/047* (2013.01); *F17C 2250/034* (2013.01); *F17C 2250/0443* (2013.01); *F17C 2270/0518* (2013.01)

(58) Field of Classification Search
CPC .............. F17C 5/007; F17C 2250/0443; F17C 2227/047; F17C 2250/034; F17C 2270/0518; H01L 21/67393; H01L 21/67769; B08B 9/08
USPC ........................................................ 141/4
See application file for complete search history.

(56) References Cited

U.S. PATENT DOCUMENTS

| | | | | |
|---|---|---|---|---|
| 5,988,233 A * | 11/1999 | Fosnight | ........... | H01L 21/67393 141/63 |
| 5,997,398 A * | 12/1999 | Yamada | ................ | F24F 3/1607 414/935 |
| 6,044,874 A * | 4/2000 | Saga | ................ | H01L 21/67393 141/48 |
| 6,817,822 B2 * | 11/2004 | Tokunaga | ......... | H01L 21/67772 414/217 |
| 6,877,105 B1 * | 4/2005 | Watanabe | ........... | H04L 43/0811 714/4.4 |

(Continued)

FOREIGN PATENT DOCUMENTS

| | | |
|---|---|---|
| JP | 200519911 A | 1/2005 |
| JP | 2007180830 A | 7/2007 |

(Continued)

*Primary Examiner* — James Hakomaki
(74) *Attorney, Agent, or Firm* — The Webb Law Firm

(57) ABSTRACT

A first control device executes, if it is determined that a second control device has become unable to output an operation instruction, continued operation processing for operating an inactive gas supply portion based on the operation instruction that was last output by the second control device. The first control device further executes, if it is determined during execution of continued operation processing that a stop condition is satisfied, operation stop processing for stopping the inactive gas supply portion by suspending the continued operation processing.

15 Claims, 10 Drawing Sheets

(56) References Cited

U.S. PATENT DOCUMENTS

| | | | | |
|---|---|---|---|---|
| 7,077,173 B2* | 7/2006 | Tokunaga | H01L 21/67017 | 141/66 |
| 7,654,291 B2* | 2/2010 | Miyajima | H01L 21/67017 | 141/4 |
| 2004/0088621 A1* | 5/2004 | Shimizu | G01R 31/31703 | 714/733 |
| 2006/0288664 A1* | 12/2006 | Okabe | H01L 21/67393 | 53/510 |
| 2007/0147232 A1* | 6/2007 | Takehara | G05B 9/02 | 370/217 |
| 2007/0220389 A1* | 9/2007 | Sato | G01R 31/31921 | 714/733 |
| 2007/0282457 A1* | 12/2007 | Araki | G05B 19/0428 | 700/1 |
| 2008/0156069 A1 | 7/2008 | Murata et al. | | |
| 2009/0238664 A1* | 9/2009 | Murata | B65G 37/02 | 414/222.02 |
| 2010/0000625 A1 | 1/2010 | Goto et al. | | |
| 2011/0173497 A1* | 7/2011 | Nakatani | G05B 19/0428 | 714/32 |
| 2011/0264972 A1* | 10/2011 | Matsuo | G01R 31/31724 | 714/733 |
| 2012/0045302 A1* | 2/2012 | Iizuka | H01L 21/67389 | 414/287 |
| 2012/0096740 A1* | 4/2012 | Naylor | H01L 21/67393 | 34/562 |
| 2013/0042945 A1* | 2/2013 | Emoto | H01L 21/67017 | 141/98 |
| 2013/0079920 A1* | 3/2013 | Tokumoto | H01L 21/6773 | 700/228 |
| 2013/0213442 A1* | 8/2013 | Kaise | H01L 21/67772 | 134/22.18 |
| 2014/0360531 A1* | 12/2014 | Fosnight | H01L 21/67775 | 134/21 |
| 2015/0202664 A1* | 7/2015 | Murata | H01L 21/67769 | 134/25.5 |

FOREIGN PATENT DOCUMENTS

| | | |
|---|---|---|
| JP | 2008159734 A | 7/2008 |
| JP | 201016199 A | 1/2010 |
| JP | 2010182747 A | 8/2010 |

* cited by examiner

INACTIVE GAS SUPPLY FACILITY AND INACTIVE GAS SUPPLY METHOD

CROSS-REFERENCE TO RELATED APPLICATION

This application claims priority to Japanese Patent Application No. 2013-134271 filed Jun. 26, 2013, the disclosure of which is hereby incorporated in its entirety by reference.

FIELD OF THE INVENTION

The present invention relates to an inactive gas supply facility including a storage section that stores a container, an inactive gas supply portion that supplies an inactive gas to an interior of the container stored in the storage section, a first control device that controls the inactive gas supply portion, and a second control device that outputs, to the first control device, an operation instruction in which a state of supply of the inactive gas is defined, and an inactive gas supply method using such an inactive gas supply facility.

BACKGROUND

As an example of the above-described inactive gas supply facility, a facility as described in JP 2010-16199A is known for which a purge process is performed in which an inactive gas (e.g., nitrogen or the like) is supplied to the interior of a container so as to prevent the contamination of the content (e.g., a semiconductor substrate or the like) accommodated in the interior of the container.

It is possible that such an inactive gas supply facility has the following configuration. That is, in the initial stage after the start of the purge process on a newly transported container, the second control device outputs, to the first control device, an operation instruction in which the supply flow rate of the inactive gas is set to an initial purging flow rate that is greater than a predetermined flow rate so as to replace any gas (e.g., water vapor, oxygen and the like) present within the container other than the inactive gas with the inactive gas as soon as possible, and the first control device controls the inactive gas supply portion based on that operation instruction.

Further, after the inactive gas within the container reaches a predetermined concentration as a result of the purge process having been continued for a predetermined period of time at the initial purging flow rate, the second control device outputs, to the first control device, an operation instruction in which the supply flow rate of the inactive gas is set to a storage purging flow rate that is smaller than the initial purging flow rate so as to maintain the concentration of the inactive gas within the container at a certain concentration, and the first control device controls the inactive gas supply portion based on that operation instruction.

SUMMARY OF THE INVENTION

Although the second control device outputs the operation instruction for adjusting the supply flow rate of the inactive gas in JP 2010-16199A described above, there may be the possibility that second control device becomes unable to output the operation instruction for switching the supply flow rate of the inactive gas due to reasons, including, for example, a failure of the second control device and an electrical disconnection between the second control device and the first control device.

Although not described in JP 2010-16199A, it is conceivable to adopt a configuration in which the first control device performs the switching of the supply flow rate of the inactive gas supply portion by using the operation instruction output from the second control device as a trigger, and operates the inactive gas supply portion based on the previous operation instruction until the next operation instruction is received. In this case, when the second control device has become unable to output the operation instruction as described above, the first control device continues the state in which it controls the inactive gas supply portion based on the operation instruction that was last output by the second control device.

However, with this configuration, when the operation instruction can no longer be outputted from the second control device in the state in which the supply flow rate of the inactive gas supply portion is set to a large flow rate, the supply flow rate cannot be switched even if the timing at which the supply flow rate of the inactive gas should be switched to a small flow rate thereafter arrives, resulting in an excessive supply of the inactive gas into the facility. Accordingly, inconveniences such as an increase in the concentration of the inactive gas in the air (or a relative decrease in the concentration of oxygen in the air) and a wasteful consumption of an expensive inactive gas may arise.

Therefore, there is a need for realization of an inactive gas supply facility capable of avoiding inconveniences caused by the inability to switch the supply flow rate of the inactive gas as much as possible when the supply of the inactive gas to the container is continued in a state in which a higher level control device is unable to output the operation instruction.

An inactive gas supply facility according to the present invention includes:

a storage section that stores a container;

an inactive gas supply portion that supplies an inactive gas to an interior of the container stored in the storage section;

a first control device that controls the inactive gas supply portion; and a second control device that outputs, to the first control device, an operation instruction in which a state of supply of the inactive gas is defined, wherein the first control device includes a state determination portion that determines that the second control device has become unable to output the operation instruction, a condition determination portion that determines whether a predetermined stop condition is satisfied, and a processing execution portion that executes processing for controlling an operation of the inactive gas supply portion, the processing execution portion executes, if it is determined by the state determination portion that the second control device has become unable to output the operation instruction, continued operation processing for operating the inactive gas supply portion based on the operation instruction that was last output by the second control device, and the processing execution portion further executes, if it is determined during execution of the continued operation processing by the condition determination portion that the stop condition is satisfied, operation stop processing for stopping the inactive gas supply portion by suspending the continued operation processing.

With the above-described configuration, when the second control device has become unable to output the operation instruction, the first control device operates the inactive gas supply portion based on the operation instruction that was last output by the second control device. Accordingly, the supply of the inactive gas to the container can be continued without being stopped, and it is possible to avoid a situation where the inactive gas is not supplied when it should be supplied to the interior of the container.

However, there may be cases where continuing the operation instruction that was last output by the second control device later becomes inappropriate, including, for example, the case where the container is moved from the storage section to another place. Therefore, by stopping the operation of the inactive gas supply portion if the stop condition is satisfied even in a state in which the supply of the inactive gas is continued without being stopped as described above, it is possible to avoid a situation where the inactive gas supply portion is operated based on the operation instruction that becomes inappropriate to be continued after the second control device has become unable to output the operation instruction.

Thus, when the supply of the inactive gas to the container is continued in a state in which the higher level control device is unable to output the operation instruction, an inconvenience caused by the inability to switch the supply flow rate of the inactive gas can be avoided as much as possible.

Technical features of the inactive gas supply facility according to the present invention are also applicable to an inactive gas supply method, and such a method may be the subject of the rights of the present invention. In this inactive gas supply method, the same functions and effects as those of the inactive gas supply facility described above can also be achieved.

That is, an inactive gas supply method according to the present invention is a method using an inactive gas supply facility, the inactive gas supply facility including:

a storage section that stores a container;

an inactive gas supply portion that supplies an inactive gas to an interior of the container stored in the storage section;

a first control device that controls the inactive gas supply portion; and a second control device that outputs, to the first control device, an operation instruction in which a state of supply of the inactive gas is defined, the inactive gas supply method including the steps performed by the first control device, the steps including:

a state determination step of determining that the second control device has become unable to output the operation instruction;

a condition determination step of determining whether a predetermined stop condition is satisfied; and a processing execution step of executing processing for controlling an operation of the inactive gas supply portion, wherein, in the processing execution step, if it is determined by the state determination step that the second control device has become unable to output the operation instruction, continued operation processing for operating the inactive gas supply portion based on the operation instruction that was last output by the second control device is executed, and, in the processing execution step, if it is determined during execution of the continued operation processing in the condition determination step that the stop condition is satisfied, operation stop processing for stopping the inactive gas supply portion by suspending the continued operation processing is further executed.

Hereinafter, examples of preferred embodiments of the present invention will be described.

In an embodiment of the inactive gas supply facility according to the present invention, it is preferable that a plurality of the storage sections are provided, each of the plurality of storage sections is separately provided with the inactive gas supply portion, the second control device outputs the operation instruction for each of the plurality of inactive gas supply portions, and the first control device separately controls each of the plurality of inactive gas supply portions based on the corresponding operation instructions for the inactive gas supply portions.

That is, the second control device can output the operation instruction for each of the inactive gas supply portions that is separately provided in the plurality of storage sections, and the first control device can separately control each of the plurality of inactive gas supply portions based on the corresponding operation instructions for the inactive gas supply portions.

Accordingly, the inactive gas can be supplied in different states of supply to the containers respectively stored in the plurality of storage sections.

In an embodiment of the inactive gas supply facility according to the present invention, it is preferable that the storage section is provided in an interior of a storage room that is partitioned from the outside, the first control device is communicatively connected to a concentration measurement device that measures a concentration of a specific component of a gas within the storage room, and the stop condition is that the concentration measured by the concentration measurement device is outside a reference state.

That is, if the concentration of the specific component of the gas within the storage room is outside the reference state, it is possible to stop the inactive gas supply portion by suspending the continued operation processing.

Examples of the cases where the concentration of the specific component of the gas within the storage room is outside the reference state include a case where the inactive gas concentration in the interior of the storage room is higher than the reference concentration, and a case where the oxygen concentration in the interior of the storage room is lower than the reference concentration. In such a case, it seems to be inappropriate to continue to supply the inactive gas to the interior of the storage room.

Therefore, if the concentration of the specific component of the gas within the storage room is outside the reference state, the inactive gas supply portion is stopped by suspending the continued operation processing. Thereby, it is possible to provide an inactive gas supply facility that can be more appropriately used.

In an embodiment of the inactive gas supply facility according to the present invention, it is preferable that the storage section is provided with a load-presence state detection device that detects a load-present state in which the container is stored and a load-absent state in which the container is not stored, the first control device is communicatively connected to the load-presence state detection device, and the stop condition is that the load-absent state is detected by the load-presence state detection device.

That is, the inactive gas will be wastefully consumed if the inactive gas is supplied to the storage section even though the container is not stored therein.

Therefore, if the load-absent state is detected by the load-presence state detection device, the inactive gas supply portion is stopped by suspending the continued operation processing. This makes it possible to suppress a wasteful consumption of the inactive gas caused by the inactive gas being supplied even though the container is not stored in the storage section.

In an embodiment of the inactive gas supply facility according to the present invention, it is preferable that the first control device includes a self failure diagnosis function of determining its own failure, and the stop condition is that the first control device has determined its own failure by the self failure diagnosis function.

That is, if the first control device has determined its own failure by the self failure diagnosis function, there is the possibility that the inactive gas supply portion cannot be controlled appropriately.

Therefore, if the first control device has determined its own failure by the self failure diagnosis function, the supply of the inactive gas from the inactive gas supply portion is stopped by suspending the continued operation processing. This makes it possible to avoid an inconvenience caused by the inability to appropriately control the inactive gas supply portion.

In an embodiment of the inactive gas supply facility according to the present invention, it is preferable that the inactive gas supply portion is a flow rate regulation device that regulates a flow rate of the inactive gas supplied to the container stored in the storage section, an intermediate control device that controls the flow rate regulation device by outputting a flow rate control instruction to the flow rate regulation device, and a higher-level control device that outputs a higher-level instruction to the intermediate control device are provided, the higher-level control device includes a monitoring portion that monitors an operating state of the flow rate regulation device and an instruction output portion that outputs the higher-level instruction to the intermediate control device based on the operating state of the flow rate regulation device that is monitored by the monitoring portion, the first control device is the intermediate control device, the second control device is the higher-level control device, and the operation instruction is the higher-level instruction.

That is, even if the higher-level control device has become unable to instruct the higher-level instruction, the intermediate control device operates the flow rate regulation device based on the higher-level instruction that was last output by the higher-level control device. Accordingly, the supply of the inactive gas to the container can be continued without being stopped.

Further, even in a state in which the intermediate control device continues the supply of the inactive gas without stopping, the operation of the flow rate regulation device is stopped if the stop condition is satisfied. Thereby, when the operation of the flow rate regulation device based on the higher-level instruction that was last output becomes inappropriate after the higher-level control device has become unable to output the higher-level instruction, the operation of the flow rate regulation device based on the higher-level instruction that was last instructed can be stopped.

In an embodiment of the inactive gas supply facility according to the present invention, it is preferable that the inactive gas supply portion is a flow rate regulation device that regulates a flow rate of the inactive gas supplied to the container stored in the storage section, an intermediate control device that controls the flow rate regulation device by outputting a flow rate control instruction to the flow rate regulation device, and a higher-level control device that outputs a higher-level instruction to the intermediate control device are provided, the higher-level control device includes a monitoring portion that monitors an operating state of the flow rate regulation device, and an instruction output portion that outputs the higher-level instruction to the intermediate control device based on the operating state of the flow rate regulation device that is monitored by the monitoring portion, the first control device is the flow rate regulation device, the second control device is the intermediate control device, and the operation instruction is the flow rate control instruction.

That is, even if the intermediate control device has become unable to instruct the flow rate control instruction, the flow rate regulation device regulates the flow rate of the inactive gas based on the flow rate control instruction that was last output by the intermediate control device. Accordingly, the supply of the inactive gas to the container can be continued without being stopped.

Further, even in a state in which the flow rate regulation device continues the supply of the inactive gas without stopping, the operation of the flow rate regulation device is stopped if the stop condition is satisfied. Thereby, when the operation of the flow rate regulation device based on the flow rate control instruction that was last output becomes inappropriate after the intermediate control device has become unable to output the flow rate control instruction, the operation of the flow rate regulation device based on the flow rate control instruction that was last output can be stopped.

In an embodiment of the inactive gas supply method according to the present invention, it is preferable that a plurality of the storage sections are provided, each of the plurality of storage sections is separately provided with the inactive gas supply portion, the second control device outputs the operation instruction for each of the plurality of inactive gas supply portions, and, in the processing execution step, each of the plurality of inactive gas supply portions is separately controlled based on the corresponding operation instructions for the inactive gas supply portions.

In an embodiment of the inactive gas supply method according to the present invention, it is preferable that the storage section is provided in an interior of a storage room that is partitioned from the outside, the first control device is communicatively connected to a concentration measurement device that measures a concentration of a specific component of a gas within the storage room, and the stop condition is that the concentration measured by the concentration measurement device is outside a reference state.

In an embodiment of the inactive gas supply method according to the present invention, it is preferable that the storage section is provided with a load-presence state detection device that detects a load-present state in which the container is stored and a load-absent state in which the container is not stored, the first control device is communicatively connected to the load-presence state detection device, and the stop condition is that the load-absent state is detected by the load-presence state detection device.

In an embodiment of the inactive gas supply method according to the present invention, it is preferable that the first control device includes a self failure diagnosis function of determining its own failure, and the stop condition is that the first control device has determined its own failure by the self failure diagnosis function.

In an embodiment of the inactive gas supply method according to the present invention, it is preferable that the inactive gas supply portion is a flow rate regulation device that regulates a flow rate of the inactive gas supplied to the container stored in the storage section, the inactive gas supply facility further includes: an intermediate control device that controls the flow rate regulation device by outputting a flow rate control instruction to the flow rate regulation device; and a higher-level control device that outputs a higher-level instruction to the intermediate control device, the higher-level control device includes a monitoring portion that monitors an operating state of the flow rate regulation device and an instruction output portion that outputs the higher-level instruction to the intermediate control device based on the operating state of the flow rate regulation device that is monitored by the monitoring portion, the first control device is the intermediate control device, the second control device is the higher-level control device, and the operation instruction is the higher-level instruction In an embodiment of the inactive gas supply method according to the present invention, it is preferable that the inactive gas supply portion is a flow rate regulation device that regulates a flow rate of the inactive gas supplied to the container stored in the storage section, the inactive gas supply facility further includes: an intermediate control device that controls the flow rate regulation device by outputting a flow rate control instruction to the flow rate regulation device; and a higher-level control device that outputs a higher-level instruction to the intermediate control device, the higher-level control device includes a monitoring portion that monitors an operating state of the flow rate regulation device, and an instruction output portion that outputs the higher-level instruction to the intermediate control device based on the operating state of the flow rate regulation device that is monitored by the monitoring portion, the first control device is the flow rate regulation device, the second control device is the intermediate control device, and the operation instruction is the flow rate control instruction.

DETAILED DESCRIPTION

Embodiments of an inactive gas supply facility according to the present invention will be described with reference to the drawings.
First Embodiment
As shown in FIGS. 1 and 2, the inactive gas supply facility includes a storage rack 10 that stores a container 50 for accommodating a substrate in a sealed state, a stacker crane 20 serving as a transport device, and a storage and retrieval conveyor CV serving as a storage and retrieval portion for the container 50.

The storage rack 10 and the stacker crane 20 are provided in an installation space whose peripheral portion is covered by a wall member K, and the storage and retrieval conveyor CV is provided in a state in which it passes through the wall member K.

The storage rack 10 includes a plurality of storage sections 10S that support the containers 50 with the storage sections 10S arranged in the vertical direction and the lateral direction (horizontal direction), and is configured such that the container 50 is stored in each of the storage sections 10S.

Figure 1:
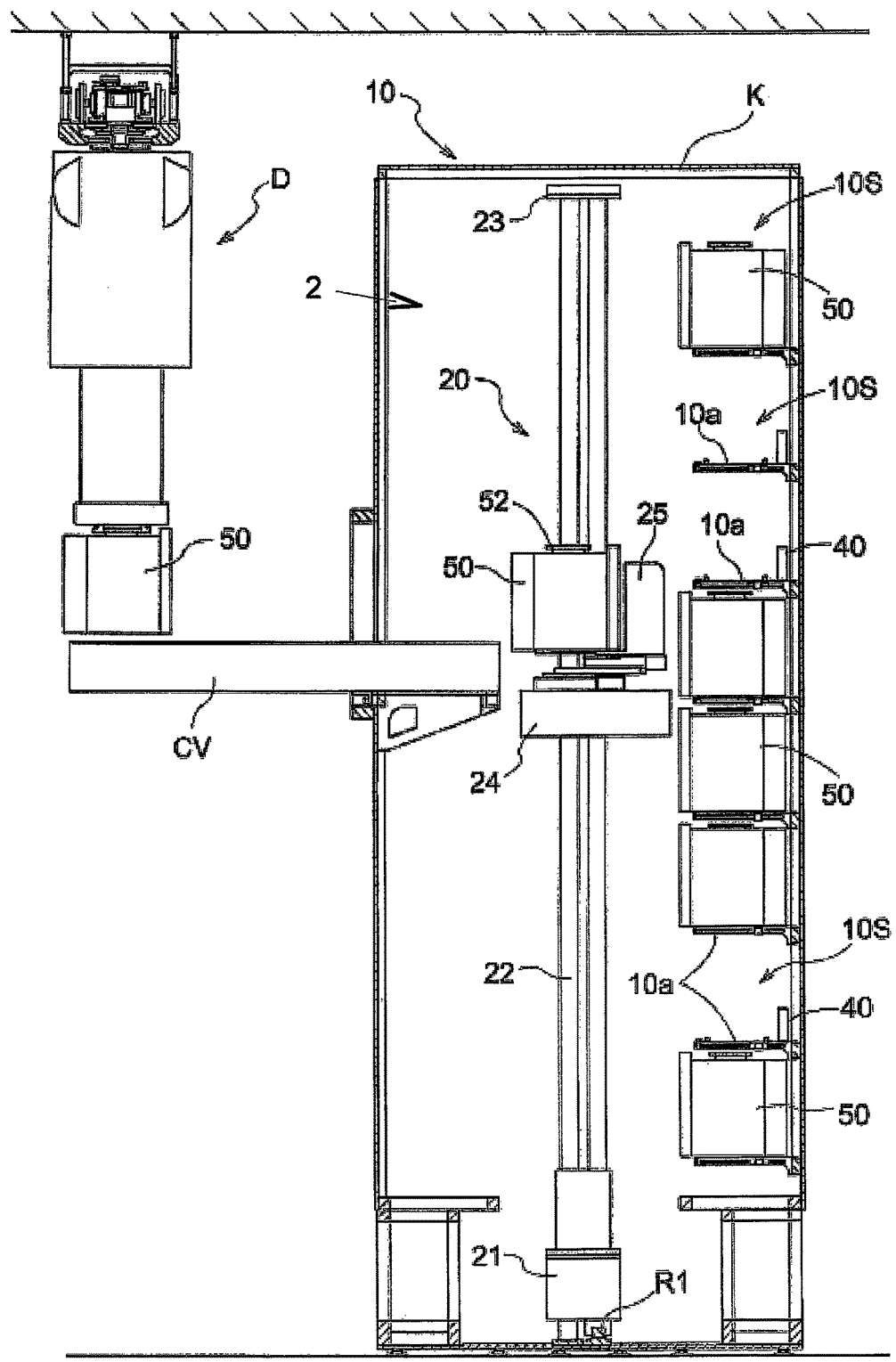
FIG. 1 is a side view illustrating an inactive gas supply facility.
Figure 2:
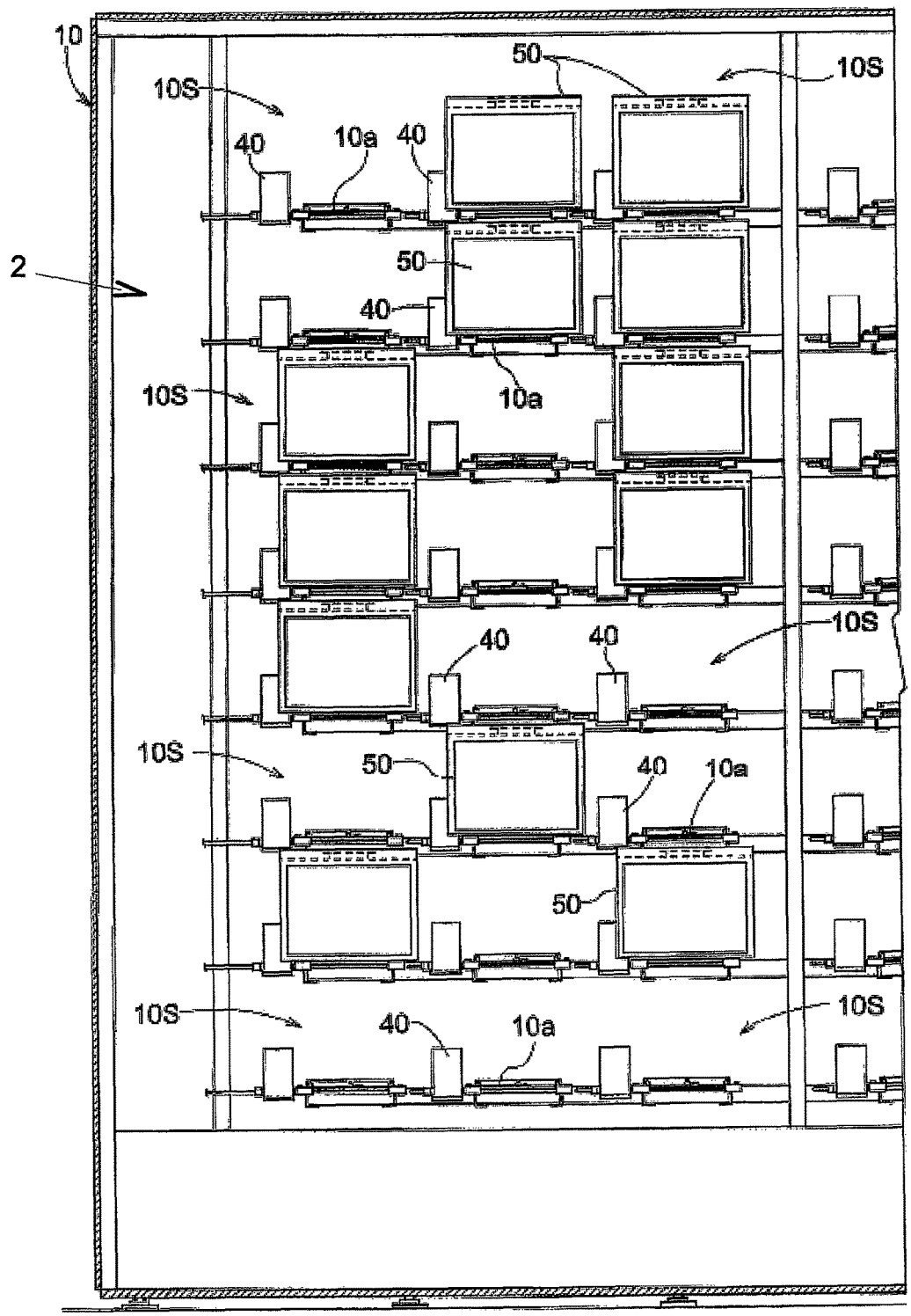
FIG. 2 is a vertically sectioned front view showing a part of the facility.

In the present embodiment, as shown in FIG. 1, a hoist-type guided vehicle D that travels along a guide rail laid on the ceiling portion of a clean room in which the article storage facility is installed is provided, and the container 50 is transported in and out of the storage and retrieval conveyor CV by the hoist-type guided vehicle D.

The container 50 is an air-tight container made of synthetic resin compliant with the SEMI (Semiconductor Equipment and Materials International) standard, is used for housing a semiconductor wafer W (see FIG. 4) serving as a substrate, and is called "FOUP (Front Opening Unified Pod)". Although the detailed description is omitted, a substrate entry opening that is open and closed by a detachable cover member is formed in the front surface of the container 50, and a top flange 52 that is grasped by a chuck portion of the guided vehicle D is formed on the top surface of the container 50. Also, three engaging grooves (not shown) with which positioning pins 10b (see FIG. 3) are engaged are formed on the bottom surface of the container 50.

Figure 4:
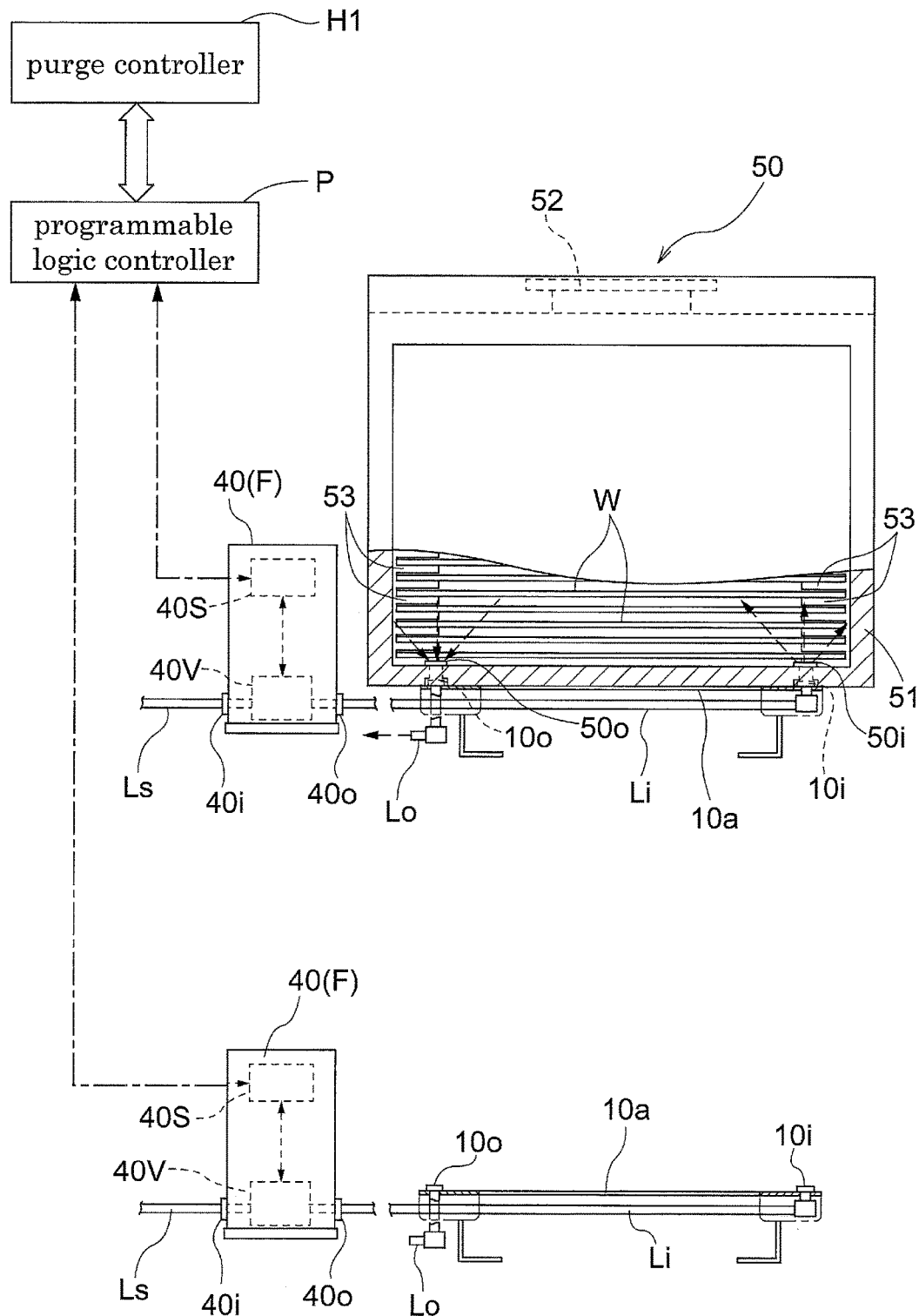
FIG. 4 is a schematic configuration diagram showing the relationship between the storage section and a container.

As shown in FIG. 4, the container 50 includes a casing 51 including therein substrate support members 53 on which a plurality of semiconductor wafers W can be placed in the vertical direction, and a cover member (not shown). The container 50 is configured such that its interior space is sealed in a state in which the cover member is attached to the casing 51. Also, the container 50 is configured to be positioned by the positioning pins 10b in a state in which it is stored in the storage section 10S.

As shown in FIG. 4, a supply port 50i and an exhaust port 50o are provided at the bottom portion of the container 50 in order to inject a nitrogen gas serving as an inactive gas, as will be described below. Although not illustrated, the supply port 50i is provided with an outflow-side open/close valve, and the exhaust port 50o is provided with a discharge-side open/close valve.

The outflow-side open/close valve is biased in the closing direction by biasing means such as a spring, and is configured to be operated to be opened by the ejection pressure of the nitrogen gas supplied to the supply port 50i when the ejection pressure is greater than or equal to a set valve-opening pressure that is higher than atmospheric pressure by a set value.

Also, the discharge-side open/close valve is biased in the closing direction by biasing means such as a spring, and is configured to be operated to be opened by the pressure within the container 50 when that pressure is greater than or equal to a set valve-opening pressure that is higher than atmospheric pressure by a set value.

The stacker crane 20 includes a traveling vehicle 21 capable of moving/traveling along a traveling rail R1 provided on the floor portion of the storage rack 10 on the front side, a mast 22 provided upright on the traveling vehicle 21, and an elevation platform 24 capable of moving up and down while being guided by the mast 22.

An upper frame 23 provided at the upper end of the mast 22 is configured to be moved by being engaged with an upper guide rail (not shown) provided on the ceiling side of the installation space whose peripheral portion is covered with the wall member K.

The elevation platform 24 is equipped with a transfer device 25 that transfers the container 50 to and from the storage section 10S.

The transfer device 25 includes a plate-like placement support member on which the container 50 is placed and supported such that the placement support member is extendable to a protruding position to protrude to the interior of the storage section 10S and is retractable to a retracted position to be retracted toward the elevation platform 24. The stacker crane 20 including the transfer device 25 is configured to perform, by the extending/retracting operation of the placement support member and the moving up/down operation of the elevation platform 24, a put-down process in which the container 50 placed on the placement support member is put down to the storage section 10S and a scoop process in which the container 50 stored in the storage section 10S is taken out.

That is, the container 50 is placed on the storage and retrieval conveyor CV by the guided vehicle D, and is transported from the exterior to the interior of the wall member K by the storage and retrieval conveyor CV before being transported to any of the plurality of storage sections 10S by the stacker crane 20.

Although not shown, the stacker crane 20 is equipped with a traveling position detection device that detects the traveling position on the traveling path and an up/down position detection device that detects the up/down position of the elevation platform 24. A crane controller H3 that controls the operation of the stacker crane 20 is configured to control the operation of the stacker crane 20 based on detection information from the traveling position detection device and the up/down position detection device.

Figure 3:
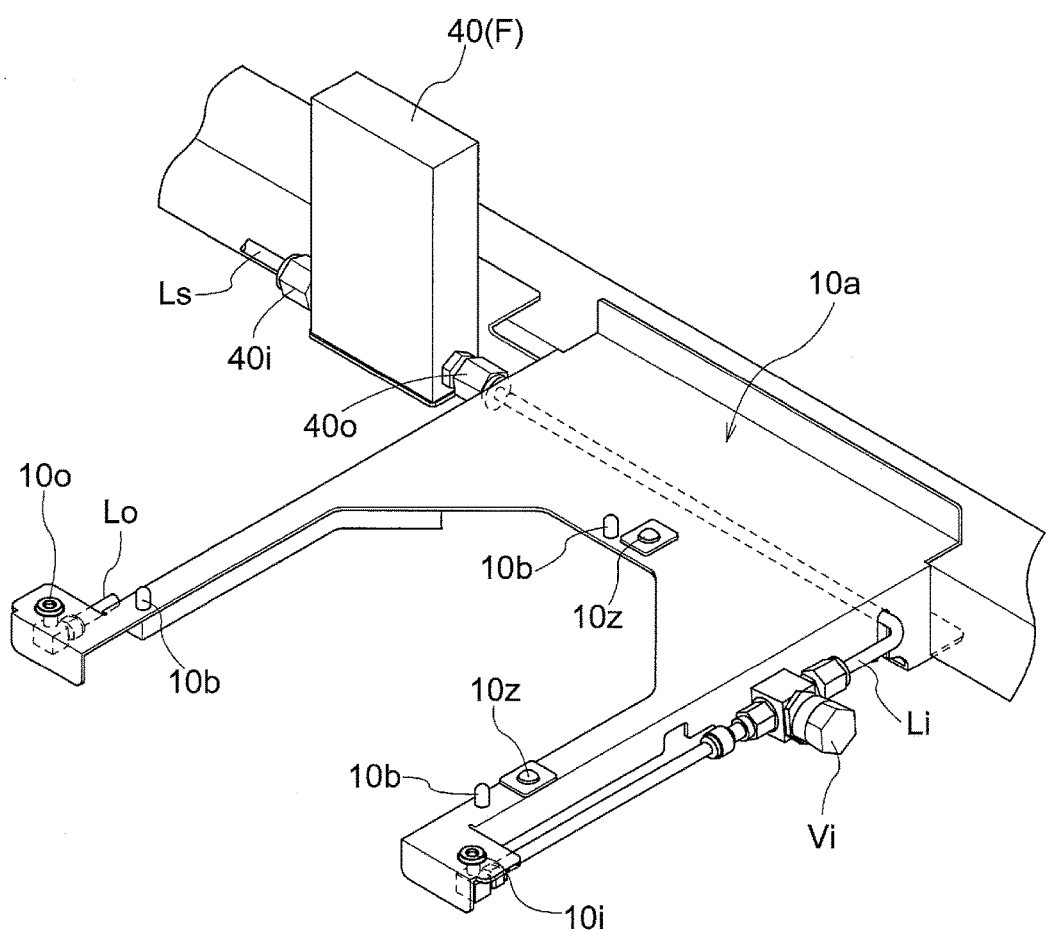
FIG. 3 is a perspective view of a storage section.

As shown in FIGS. 3 and 4, each of the plurality of storage sections 10S includes a plate-like placement support portion 10a on which the container 50 is placed and supported.

The placement support portion 10a is formed in a U-shape in plan view so as to form a space through which the placement support member of the transfer device 25 passes in the vertical direction. Also, on the top surface of the placement support portion 10a are provided the above-described positioning pins 10b in an upright state (in an upwardly protruding state).

Further, the placement support portion 10a is provided with two load presence sensors 10z that detects whether or not the container 50 is placed thereon (i.e., whether or not the container 50 is stored in the storage section 10S). The detection information from the load presence sensors 10z is input via a programmable logic controller P to a purge controller H1 that monitors the operating state of a mass flow controller 40.

The placement support portion 10a is provided with an ejection nozzle 10i serving as an ejection outlet for supplying a nitrogen gas serving as an inactive gas to the interior of the container 50, and a discharging ventilation member 10o through which the gas discharged from the interior of the container 50 is passed. Also, a supply pipe Li through which the nitrogen gas from the mass flow controller 40 is flowed is connected to the ejection nozzle 10i, and an exhaust pipe Lo whose end portion is open is connected to the discharging ventilation member 10o.

Further, as shown in FIGS. 1 and 2, the mass flow controller 40 that controls the supply of the nitrogen gas is provided at a position that is located on the rack back side of the storage section 10S in plan view (the side on the end portion that is opposite to the opening through which the container 50 is placed in or taken out) and that is in the vicinity of an end portion of the container 50 in the rack horizontal direction.

A mass flow controller 40 is provided so as to correspond to each of the storage sections 10S.

When the container 50 is placed and supported on the placement support portion 10a, the ejection nozzle 10i is connected in a fitted state to the supply port 50i of the container 50 and the discharging ventilation member 10o is connected in a fitted state to the exhaust port 50o of the container 50.

By ejecting a nitrogen gas having a pressure higher than atmospheric pressure by a set value or more from the ejection nozzle 10i with the container 50 being placed and supported on the placement support portion 10a, the nitrogen gas can be injected to the interior of the container 50 from the supply port 50i of the container 50 with the gas within the container being discharged from the exhaust port 50o of the container 50 to the outside.

In the present embodiment, the mass flow controller 40 constitutes an inactive gas supply portion F. Further, a storage room 2 according to the present invention is formed by covering the peripheral portion of the installation space with the wall member K.

That is, a plurality of the storage sections 10S capable of storing the containers 50 are provided, and each of the storage sections 10S is separately provided with the inactive gas supply portion F that supplies a nitrogen gas to the interior of the container 50 stored in the storage section 10S. Further, the storage sections 10S are provided in the interior of the storage room 2 that is partitioned from the outside.

(Configuration for Supplying Nitrogen Gas)

Figure 5:
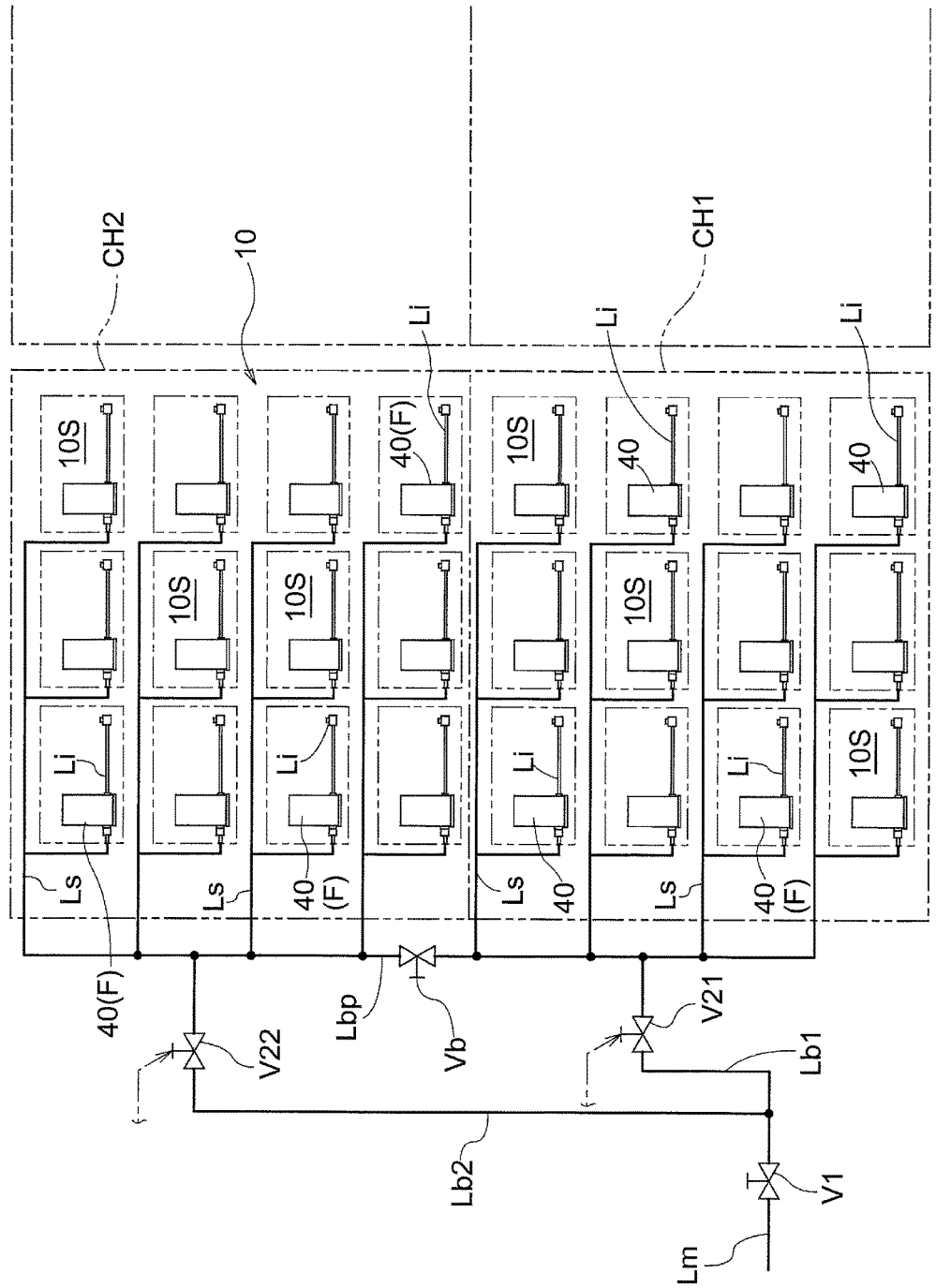
FIG. 5 is a diagram showing a configuration in which a nitrogen gas is supplied to a plurality of storage sections.

As shown in FIG. 5, a source gas supply pipe Lm is provided as a nitrogen gas supply source for supplying a nitrogen gas to each of the inactive gas supply portions F in the storage rack 10. A first branched supply pipe Lb1 and a second branched supply pipe Lb2 are provided in a state in which they are bifurcated from the source gas supply pipe Lm. The source gas supply pipe Lm is provided with a source gas open/close valve V1, and can switch between the supply and the stop of supply of a nitrogen gas for each storage rack 10.

The first branched supply pipe Lb1 is provided with a first electromagnetic open/close valve V21, and the second branched supply pipe Lb2 is provided with a second electromagnetic open/close valve V22. Also, the first electromagnetic open/close valve V21 and the second electromagnetic open/close valve V22 are electrically connected to a purge controller H1, which will be described below, via an I/O expansion module A, which will be described below, and the purge controller H1 is configured to control the opening and closing of the first electromagnetic open/close valve V21 and the second electromagnetic open/close valve V22.

(Configuration of Mass Flow Controller 40)

As shown in FIGS. 3 and 4, the mass flow controller 40 includes an inflow-side port 40i and an outflow-side port 40o. The supply pipe Li described above is connected to the outflow-side port 40o, and a supply pipe Ls that guides the nitrogen gas from the first branched supply pipe Lb1 or the second branched supply pipe Lb2 serving as the nitrogen gas supply source is connected to the inflow-side port 40i.

Note that the nitrogen gas supply source is equipped, for example, with a governor that adjust the supply pressure of the nitrogen gas to a set pressure that is higher than atmospheric pressure by a set value or more, or with a manually operated open/close valve that interrupts the supply of the nitrogen gas.

The mass flow controller 40 is equipped with a flow rate regulating valve 40V that changes/regulates the flow rate of the nitrogen gas flowing through the internal flow path extending from the inflow-side port 40i toward the outflow-side port 40o, a flow rate sensor that measures the flow rate of the nitrogen gas flowing through the internal flow path, and an internal control portion 40S that controls the operation of the flow rate regulating valve.

Further, the internal control portion 40S of the mass flow controller 40 includes a self failure diagnosis function of determining its own failure.

In the present embodiment, the mass flow controller 40 corresponds to the flow rate regulation device.

(Control Configuration)

Figure 6:
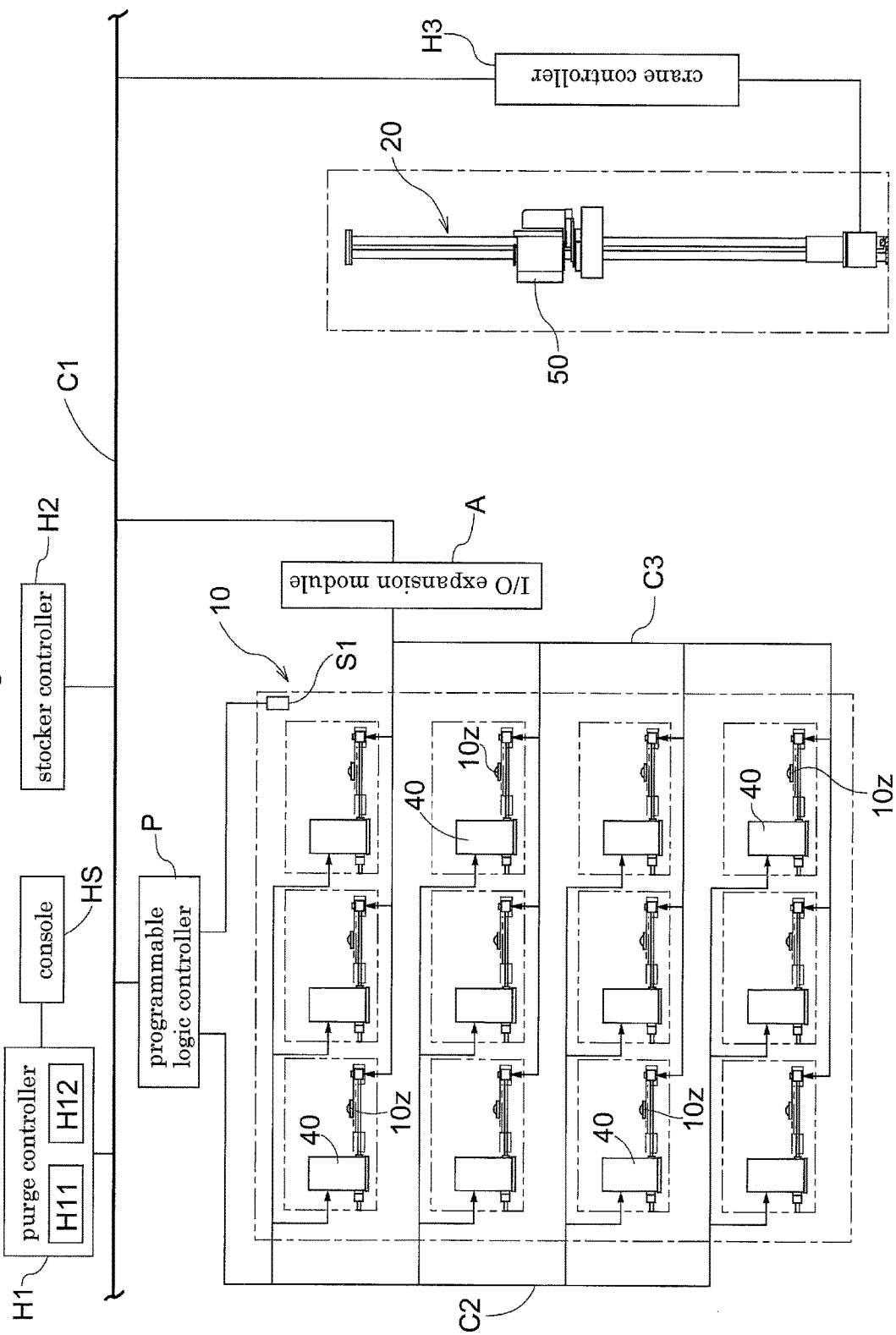
FIG. 6 is a diagram showing a control configuration.

As shown in FIG. 6, the inactive gas supply facility is provided with a purge controller H1 that outputs a higher-level instruction to the programmable logic controller P, a stocker controller H2 that manages the inventory status or the like of the containers 50 in the storage rack 10, and a crane controller H3 that controls the operation of the stacker crane 20.

The purge controller H1 includes a monitoring portion H11 and an instruction output portion H12.

The monitoring portion H11 is configured to monitor the operating state of the mass flow controller 40, and the instruction output portion H12 is configured to output a higher-level instruction to the programmable logic controller P based on the operating state of the mass flow controller 40 that is monitored by the monitoring portion H11.

The purge controller H1, the stocker controller H2, and the crane controller H3 are each constituted by a computer capable of processing information, for example, by a stored-program method, and are connected to one another by a network C1 such as a LAN. Further, the programmable logic controller P and the I/O expansion module A are connected to the network C1 so as to be able to communicate with the purge controller H1.

To the programmable logic controller P are connected twelve mass flow controllers 40 via a control bus C2, and a concentration measurement device S1 that measures the oxygen concentration in the air within the storage room 2. That is, the programmable logic controller P is communicatively connected to the concentration measurement device S1 that measures the concentration of oxygen as a specific component of the gas within the storage room 2. The concentration measurement device S1 is configured to output warning information when the concentration of oxygen in the air within the storage room 2 is less than a specified concentration.

Figure 7:
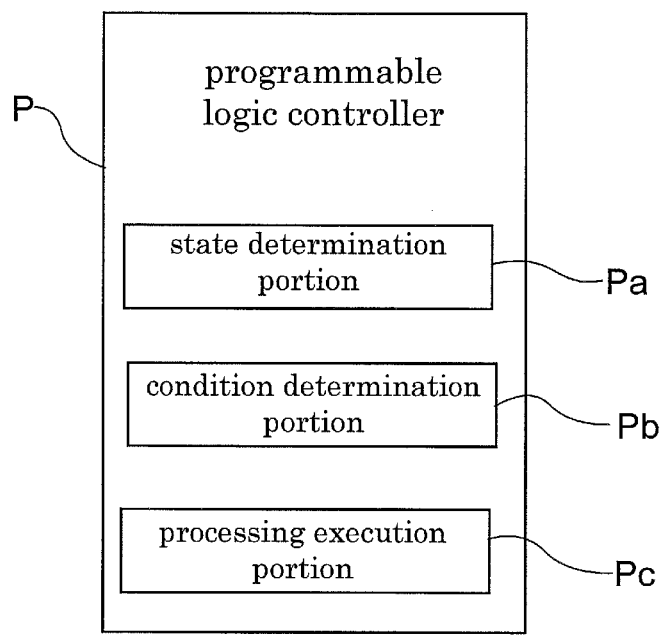
FIG. 7 is a diagram illustrating the configuration of a programmable logic controller in a first embodiment.

Further, as shown in FIG. 7, the programmable logic controller P includes a state determination portion Pa that determines that the purge controller H1 has become unable to output the operation instruction, a condition determination portion Pb that determines whether a predetermined stop condition is satisfied, and a processing execution portion Pc that executes the processing for controlling the operation of the mass flow controllers 40.

The programmable logic controller P is configured to, when it receives identification information of a mass flow controller 40 and an instruction of the target flow rate for that mass flow controller 40 from the purge controller H1, output the instruction of the target flow rate to the mass flow controller 40 corresponding to the identification information.

The state determination portion Pa is configured to check whether communication is established with the purge controller H1 by transmitting a connection confirmation signal to the purge controller H1 at a set time interval, and receiving a response signal transmitted back from the purge controller H1 for the connection confirmation signal. Then, the state determination portion Pa determines that the purge controller H1 is able to output the operation instruction if communication is established with the purge controller H1, and determines that the purge controller H1 is unable to output the operation instruction if communication is not established with the purge controller H1. The step of performing this determination corresponds to "state determination step" in the present invention.

The state determination portion Pa also has a self failure diagnosis function of determining its own failure.

The load presence sensors 10z corresponding to the storage sections 10S provided with the twelve mass flow controllers 40 are connected to the I/O expansion module A by a signal line C3. The information that is input to the I/O expansion module A is aggregated in the programmable logic controller P. In the present embodiment, the load presence sensor 10z corresponds to a load-presence state detection device. That is, the storage section 10S is provided with load presence sensors 10z that detect a load-present state in which the container 50 is stored and a load-absent state in which the container 50 is not stored, and the programmable logic controller P is communicatively connected to the load presence sensors 10z and the concentration measurement device S1.

The purge controller H1 instructs, to the programmable logic controller P, a target flow rate for each of the mass flow controllers 40 that are installed respectively corresponding to the plurality of storage sections 10S. The instruction of the target flow rate that is instructed by the purge controller H1 to the programmable logic controller P for each of the plurality of mass flow controllers 40 in this way corresponds to the higher-level instruction. The internal control portion 40S of the mass flow controller 40 controls the flow rate regulating valve 40V so as to adjust the supply flow rate to the container 50 to the target flow rate defined in the above-described higher-level instruction from the purge controller H1, based on the detection information from the flow rate sensor. Further, the purge controller H1 is equipped with a console HS for inputting various types of information.

That is, the inactive gas supply portion is a flow rate regulation device (mass flow controller 40) that regulates the flow rate of the nitrogen gas supplied to the container 50 stored in the storage section 10S. The programmable logic controller P that controls the mass flow controller 40 by outputting the flow rate control instruction to the mass flow controller 40, and the purge controller H1 that outputs the higher-level instruction to the programmable logic controller P are provided.

Further, the purge controller H1 includes the monitoring portion H11 that monitors the operating state of the mass flow controller 40, and the instruction output portion H12 that outputs the higher-level instruction to the programmable logic controller P based on the operating state of the mass flow controller 40 that is monitored by the monitoring portion H11.

That is, in the present embodiment, the programmable logic controller P corresponds to an intermediate control device that controls the mass flow controller 40 serving as the flow rate regulation device, and the purge controller H1 corresponds to a higher-level control device that outputs the higher-level instruction in which the state of supply of the nitrogen gas is defined to the programmable logic controller P.

Further, the inactive gas supply facility of the present embodiment includes the programmable logic controller P that controls the mass flow controller 40, and the purge controller H1 that outputs the higher-level instruction in which the state of supply of the inactive gas is defined to the programmable logic controller P. That is, in the present embodiment, the programmable logic controller P corresponds to a first control device, the purge controller H1 corresponds to a second control device, and the higher-level instruction output by the purge controller H1 to the programmable logic controller P corresponds to the operation instruction.

The target flow rates defined in the higher-level instructions output by the purge controller H1 include a storage target flow rate, a nozzle cleaning target flow rate, and a cleaning target flow rate. The storage target flow rate is a target flow rate that is instructed to the mass flow controller 40 so as to inject the nitrogen gas to the interior of the container 50 in the state in which the container 50 is stored in the storage section 10S. The nozzle cleaning target flow rate is a target flow rate that is instructed immediately before the container 50 is stored in the storage section 10S for cleaning the ejection nozzle 10i. The cleaning target flow rate is a target flow rate that is instructed, for example, during the installation of the storage rack 10 for cleaning the ejection nozzle 10i, the supply pipe Li and so forth.

Figure 8:
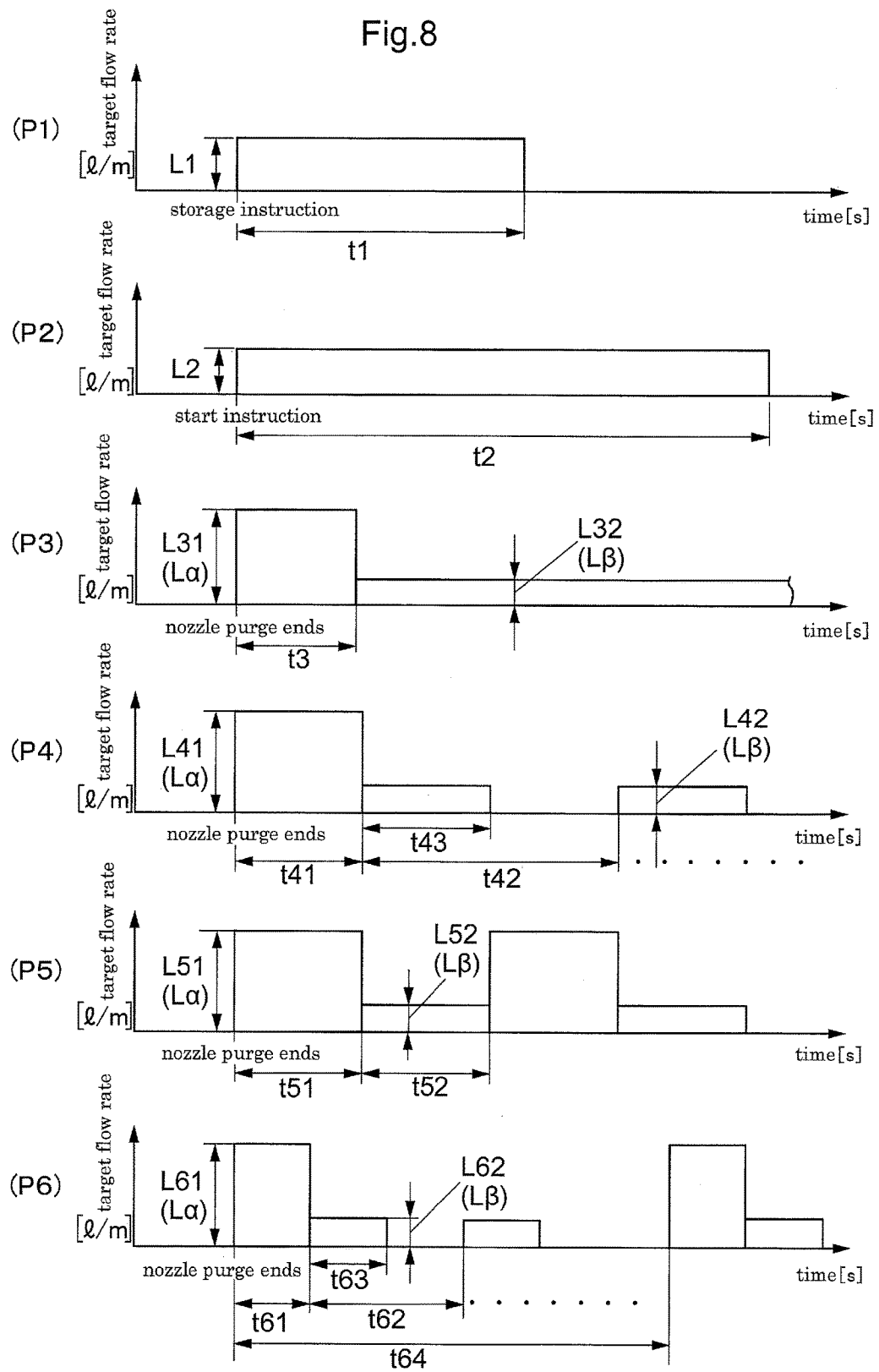
FIG. 8 shows graphs illustrating the relationship between a target flow rate and a supply period for each purge pattern.

As shown in FIG. 8, the purge controller H1 stores, as a plurality of purge patterns in which the target flow rate and the supply period are defined, a nozzle purge pattern P1, a cleaning pattern P2, and four storage purge patterns P3 to P6.

Also, the purge controller H1 is configured to, when the cleaning start instruction is instructed at the console HS, for example, during the installation of the storage rack 10, output the higher-level instruction corresponding to the cleaning pattern P2 to the programmable logic controller P. The programmable logic controller P that has received the higher-level instruction controls the operation of the mass flow controller 40 so as to set a cleaning supply mode in which a nitrogen gas at a cleaning target flow rate (cleaning flow rate) is flowed for a cleaning time to clean the inactive gas supply portion F.

Note that the console HS is configured to be able to select the inactive gas supply portion F that requires cleaning, and instruct the cleaning start instruction to the selected inactive gas supply portion F.

Further, the purge controller H1 is configured to, when the container 50 is transported into the storage and retrieval conveyor CV, output the higher-level instruction corresponding to the nozzle purge pattern P1 to the programmable logic controller P. The programmable logic controller P that has received the higher-level instruction controls the operation of the mass flow controller 40 so as to supply the nitrogen gas at the nozzle cleaning target flow rate.

In the present embodiment, the purge controller H1 is configured to determine the transport of the container 50 into the storage and retrieval conveyor CV, based on the storage instruction communicated from a guided vehicle controller (not shown) that controls the operation of the hoist-type guided vehicle D.

Furthermore, the purge controller H1 is configured to, when the two load presence sensors 10z are detecting the container 50, output, to the programmable logic controller P, the higher-level instruction corresponding to one of the four storage purge patterns P3 to P6 that is pre-selected at the console HS. The programmable logic controller P that has received the higher-level instruction controls the operation of the mass flow controller 40 so as to supply the nitrogen gas at the storage target flow rate (supply flow rate) corresponding to the pre-selected storage purge pattern.

The target flow rate and the supply period in the nozzle purge pattern P1 and the cleaning pattern P2 are set to a reference state in advance. The target flow rate and the supply period in each of the four storage purge patterns P3 to P6 are set by the user during the installation of the facility. Note that the setting of the reference state is configured to be changeable from the console HS.

Next, each of the nozzle purge pattern P1, the cleaning pattern P2, and the four storage purge patterns P3 to P6 will be described with reference to FIG. 8.

The nozzle purge pattern P1 is defined as a pattern for supplying the nitrogen gas at a target flow rate L1, which is set as the nozzle cleaning target flow rate, for a supply period t1, which is set as a pre-storing supply period from the time at which the storage instruction is instructed.

The supply period t1 is set to 5 seconds, for example, and the target flow rate L1 is set to 30 L/min, for example.

The cleaning pattern P2 is set as a pattern for supplying a nitrogen gas at a target flow rate L2, which is set as a cleaning target flow rate, for a supply period t2, which is set as an early installation supply period since the cleaning start instruction has been instructed at the console HS.

The supply period t2 is set to 1800 seconds, for example, and the target flow rate L2 is set to 20 L/min, for example.

For each of the four storage purge patterns P3 to P6, an initial target flow rate value $L\alpha$ and a steady target flow rate value $L\beta$ that is smaller than the initial target flow rate $L\alpha$ are set as the storage target flow rates.

The initial target flow rate value $L\alpha$ is set to 50 L/min, for example, and the steady target flow rate value $L\beta$ is set to 5 L/min, for example. As described above, the initial target flow rate value $L\alpha$ and the steady target flow rate value $L\beta$ can be changed by the user.

Also, the four storage purge patterns P3 to P6 are similar in that at the time of supplying a nitrogen gas to the container 50, the target flow rate value is first set to the initial target flow rate value $L\alpha$, and thereafter, the target flow rate value is changed to the steady target flow rate value $L\beta$. However, they are set to be patterns different from one another. As shown in FIG. 8, the four storage purge patterns P3 to P6 are set to patterns in which the target flow rate is switched over time, but the detailed description thereof is omitted here.

(Processing Executed by Programmable Logic Controller)

Figure 9:
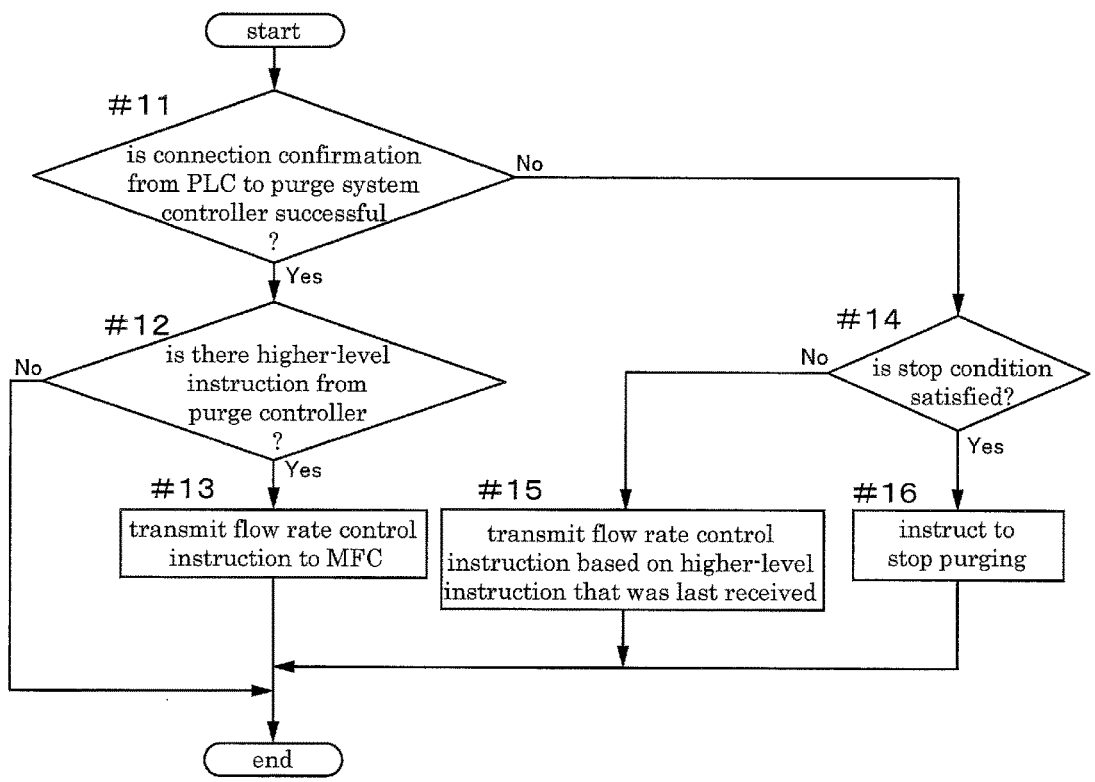
FIG. 9 is a flowchart illustrating the control performed by the programmable logic controller in the first embodiment.

When the inactive gas supply facility is used, the purge controller H1 may become unable to output the higher-level instruction due to circumstances such as a freeze-up of the computer and a failure of the communication interface even though the purge process for supplying a nitrogen gas to the container 50 is being performed by the mass flow controller 40. When such a circumstance occurs, the purge controller H1 may become unable to output the higher-level instruction, for example, in a state in which the supply flow rate of the nitrogen gas supplied by the mass flow controller 40 is set to the initial target flow rate value $L\alpha$ based on the above-described storage purge patterns P3 to P6, and there is the possibility that the purge controller H1 may not be able to output the higher-level instruction for instructing to change the supply flow rate even though the timing at which the supply flow rate should be set to the steady target flow rate value LB arrives. The processing executed by the programmable logic controller P in such a case will be described with reference to FIG. 9. Note that the flow shown in FIG. 9 is repeated at an interval of a set period (i.e., a control cycle of, for example, 100 milliseconds).

The state determination portion Pa included in the programmable logic controller P first determines whether the connection with the purge controller H1 can be confirmed (step #11). If it is determined in step #11 that the connection with the purge controller H1 can be confirmed (step #11: Yes), the state determination portion Pa checks whether there is a higher-level instruction from the purge controller H1 (step #12). If it is determined in step #12 that there is a higher-level instruction from the purge controller H1 (step #12: Yes), the processing execution portion Pc included in the programmable logic controller P subsequently transmits the flow rate control instruction to the mass flow controller 40 (step #13).

If it is determined in step #12 that there is no operation instruction from the purge controller H1 (step #12: No), this flow ends.

On the other hand, if the state determination portion Pa determines in step #11 that the connection with the purge controller H1 cannot be confirmed (step #11: No), the condition determination portion Pb determines whether the stop condition is satisfied (step #14). The step of determining whether the stop condition is satisfied corresponds to "condition determination step" of the present invention.

The stop condition is any of the conditions that "the oxygen concentration measured by the concentration measurement device S1 is below the reference concentration", that "the load-absent state is detected by the load presence sensors 10z", and that "the programmable logic controller P has determined its own failure by the self failure diagnosis function". The condition determination portion Pb determines that the stop condition is satisfied if any of the three conditions is satisfied.

In the present embodiment, the condition that the oxygen concentration measured by the concentration measurement device S1 is below the reference concentration corresponds to the condition that the concentration of the specific component of the gas within the storage room 2 that is measured by the concentration measurement device S1 is outside the reference state.

If it is determined in step #14 that the stop condition is not satisfied (step #14: No), the processing execution portion Pc transmits the flow rate control instruction to the mass flow controller 40 based on the higher-level instruction that was last instructed by the purge controller H1 (step #15). In the present embodiment, the processing of step #15 corresponds to the continued operation processing.

If it is determined in step #14 that the stop condition is satisfied (step #14: Yes), the processing execution portion Pc instructs the mass flow controller 40 to stop purging (to close the flow rate regulating valve 40V) (step #16). In the present embodiment, the processing of step #16 corresponds to the operation stop processing.

That is, if it is determined by the state determination portion Pa that the purge controller H1 has become unable to output the operation instruction, the processing execution portion Pc executes the continued operation processing for operating the mass flow controller 40, based on the operation instruction that was last output by the purge controller H1. Furthermore, the processing execution portion Pc is configured to, if it is determined by the condition determination portion Pb during execution of the continued operation processing that the stop condition is satisfied, execute the operation stop processing for stopping the mass flow controller 40 by suspending the continued operation processing. The step of executing the processing for controlling the operation of the mass flow controller 40, including the continued operation processing and the operation stop processing, corresponds to "processing execution step" in the present invention.

Second Embodiment

Next, a second embodiment of the inactive gas supply facility will be described. The second embodiment is different from the first embodiment only with respect to the relationship between the first control device and the second control device. Accordingly, only different portions will be described and redundant descriptions have been omitted.

Figure 10:
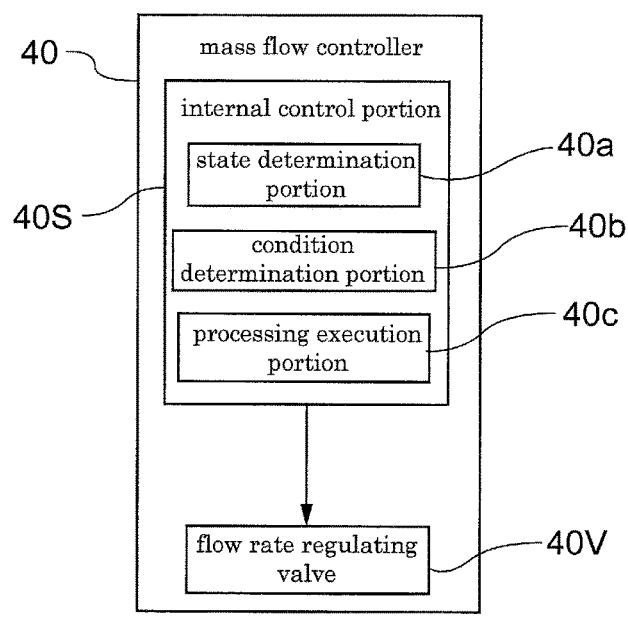
FIG. 10 is a diagram illustrating the configuration of a mass flow controller in a second embodiment.

In the present embodiment, as shown in FIG. 10, the mass flow controller 40 includes a state determination portion 40a that determines that the programmable logic controller P has become unable to output the flow rate control instruction, a condition determination portion 40b that determines whether a predetermined stop condition is satisfied, and a processing execution portion 40c that executes the processing for controlling the operation of the flow rate regulating valve 40V in the mass flow controller 40.

Also, the mass flow controller 40 is communicatively connected to the concentration measurement device S1 that measures the concentration of oxygen within the storage room 2 and each of the load presence sensors 10z corresponding to the storage sections 10S via the control bus C2.

The state determination portion 40a is configured to determine whether communication is established with the programmable logic controller P by transmitting a connection confirmation signal to the programmable logic controller P at a set time interval, and receiving a response signal that is transmitted back from the programmable logic controller P for the connection confirmation signal. Also, the state determination portion 40a is configured to determine that the programmable logic controller P is able to output the operation instruction if communication is established with the programmable logic controller P, and determine that the programmable logic controller P is unable to output the operation instruction if communication is not established with the programmable logic controller P.

Further, the state determination portion 40a also includes a self failure diagnosis function of determining its own failure.

The programmable logic controller P instructs the target flow rate so as to adjust the target flow rate for each of the mass flow controllers 40 to the target flow rate that is defined in the higher-level instruction from the purge controller H1 for the target flow rate of each of the mass flow controllers 40 that are installed respectively corresponding to the plurality of storage sections 10S. The instruction of the target flow rate that is instructed by the programmable logic controller P to the mass flow controllers 40 in this way corresponds to the flow rate control instruction. The internal control portion 40S of the mass flow controller 40 controls the flow rate regulating valve 40V so as to adjust the supply flow rate to the container 50 to the target flow rate defined in the flow rate control instruction from the programmable logic controller P described above, based on the detection information from the flow rate sensor.

That is, in the present embodiment, the internal control portion 40S included in the mass flow controller 40 corresponds to the first control device, the programmable logic controller P corresponds to the second control device, and the flow rate control instruction that is output by the programmable logic controller P to the mass flow controller 40 corresponds to the operation instruction.

(Processing Executed by Mass Flow Controller)

Figure 11:
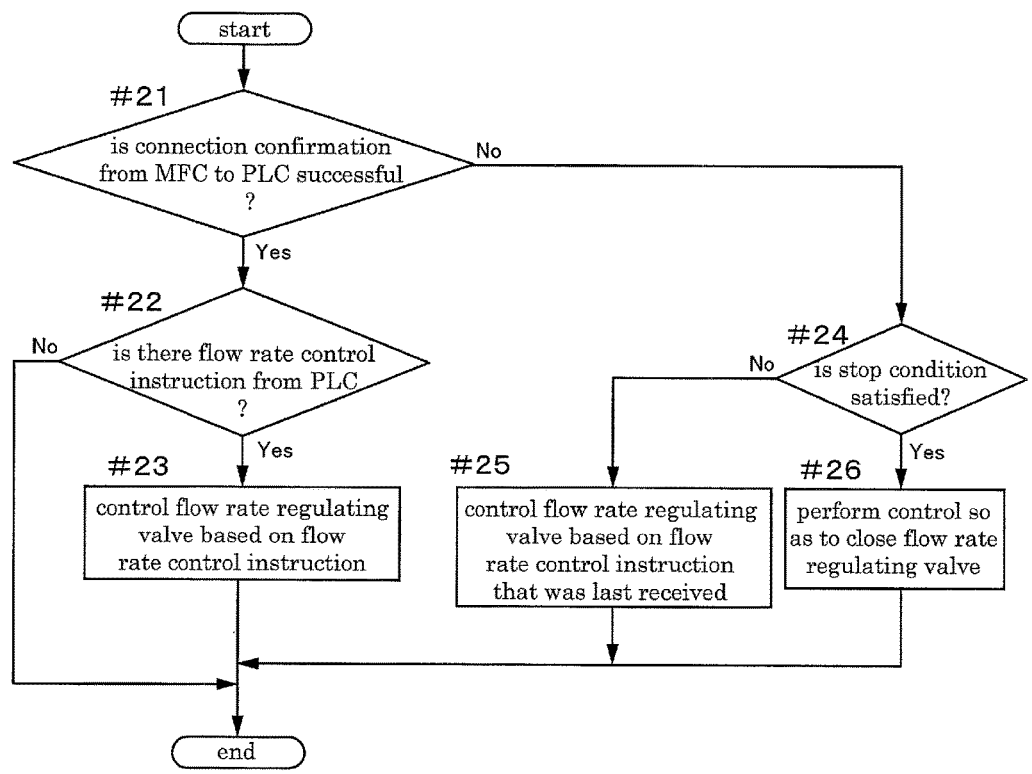
FIG. 11 is a flowchart illustrating the control performed by the mass flow controller in the second embodiment.

When the inactive gas supply facility is used, the programmable logic controller P may become unable to output the flow rate control instruction due to circumstances such as a failure of the communication interface even though the purge process for supplying a nitrogen gas to the container 50 is being performed by the mass flow controller 40. When such a circumstance occurs, the programmable logic controller P may become unable to output the flow rate control instruction, for example, in a state in which the supply flow rate of the nitrogen gas supplied by the mass flow controller 40 is set to the initial target flow rate value La based on the above-described storage purge patterns P3 to P6, and there is the possibility that the programmable logic controller P may not be able to output the flow rate control instruction for instructing to change the supply flow rate even though the timing at which the supply flow rate should be set to the steady target flow rate value LB arrives. The processing executed by the mass flow controller 40 in such a case will be described with reference to FIG. 11. Note that the flow shown in FIG. 11 is repeated at an interval of a set period (i.e., a control cycle of, for example, 100 milliseconds).

The state determination portion 40a included in the mass flow controller 40 first determines whether the connection with the programmable logic controller P can be confirmed (step #21). If it is determined in step #21 that the connection with the programmable logic controller P can be confirmed (step #21: Yes), the state determination portion 40a checks whether there is a flow rate control instruction from the programmable logic controller P (step #22). If it is determined in step #22 that there is a flow rate control instruction from the programmable logic controller P (step #22: Yes), the processing execution portion 40c included in the mass flow controller 40 subsequently controls the flow rate regulating valve 40V based on the flow rate control instruction (step #23).

If it is determined in step #22 that there is no flow rate control instruction from the programmable logic controller P (step #22: No), this flow ends.

On the other hand, if the state determination portion 40a determines in step #21 that the connection with the programmable logic controller P cannot be confirmed (step #21: No), the condition determination portion 40b determines whether the stop condition is satisfied (step #24). The stop condition is any of the conditions that "the oxygen concentration measured by the concentration measurement device S1 is below the reference concentration", that "the load-absent state is detected by the load presence sensors 10z", and that "the internal control portion 40S of the mass flow controller 40 has determined its own failure by the self failure diagnosis function". The condition determination portion 40b determines that the stop condition is satisfied if any of the three conditions is satisfied.

If it is determined in step #24 that the stop condition is not satisfied (step #24: No), the processing execution portion 40c controls the flow rate regulating valve 40V based on the flow rate control instruction that was last received from the programmable logic controller P (step #25). In the present embodiment, the processing of step #25 corresponds to the continued operation processing.

If it is determined in step #24 that the stop condition is satisfied (step #24: Yes), the processing execution portion 40c performs control so as to close the flow rate regulating valve 40V (step #26). In the present embodiment, the processing of step #26 corresponds to the operation stop processing.

That is, if it is determined by the state determination portion 40a that the programmable logic controller P has become unable to output the flow rate control instruction, the processing execution portion 40c executes the continued operation processing for operating the mass flow controller 40 based on the operation instruction that was last output by the purge controller H1. Furthermore, the processing execution portion 40c is configured to, if it is determined by the condition determination portion 40b during execution of the continued operation processing that the stop condition is satisfied, execute the operation stop processing for stopping the mass flow controller 40 by suspending the continued operation processing.

Other Embodiments (1) The first and second embodiments illustrate the configuration in which a plurality of storage sections 10S are provided, and each of the plurality of storage sections 10S is separately provided with the mass flow controller 40. However, embodiments of the present invention are not limited to such a configuration, and it is possible to adopt a configuration in which the inactive gas supply facility includes, for example, only one storage section 10S and the one storage section 10S includes one mass flow controller 40. It is also possible to adopt a configuration in which a plurality of storage sections 10S are provided and the flow rate of the nitrogen gas supplied to the containers 50 stored in the plurality of storage sections 10S is regulated by one mass flow controller 40. Although the first and second embodiments adopt the configuration in which the second control device separately outputs the operation instruction for each of the plurality of mass flow controllers 40, it is possible to adopt a configuration in which the second control device outputs the same operation instruction for all of the plurality of mass flow controllers 40.

(2) The first embodiment adopts the configuration in which the stop condition is any of the conditions that "the oxygen concentration measured by the concentration measurement device 51 is below the reference concentration", that "the load-absent state is detected by the load presence sensors 10z", and that "the programmable logic controller P has determined its own failure by the self failure diagnosis function". The second embodiment adopts the configuration in which the stop condition is any of the conditions that "the oxygen concentration measured by the concentration measurement device S1 is below the reference concentration", that "the load-absent state is detected by the load presence sensors 10z", and that "the internal control portion 40S of the mass flow controller 40 has determined its own failure by the self failure diagnosis function". However, the stop condition is not limited thereto, and may include other conditions such as the condition that "emergency stopping is instructed by the operator". Also, instead of all of the three conditions described in the first or second embodiment, one or two of them may be used as the stop condition.

Furthermore, although the first and second embodiments adopt the configuration in which whether the stop condition is satisfied is determined by the condition that any of the above-described three conditions is satisfied, it is possible to adopt a configuration in which whether the stop condition is satisfied is determined by the condition that two or three of the above-described three conditions that are preset are satisfied.

(3) The second embodiment illustrates the configuration in which the mass flow controller 40 is communicatively connected via the control bus C2 to the concentration measurement device S1 that measures the concentration of oxygen within the storage room 2 and each of the load presence sensors 10z corresponding to the storage sections 10S. However, embodiments of the present invention are not limited to such a configuration, and it is possible to adopt a configuration in which the concentration measurement device S1 and each of the load presence sensors 10z is connected to the mass flow controller 40 so as to directly input measurement information into the mass flow controller 40.

(4) The first and second embodiments illustrate the configuration in which the specific component of the gas within the storage room 2 is oxygen and the concentration of oxygen is measured by the concentration measurement device S1. However, embodiments of the present invention are not limited to such a configuration, and it is possible to adopt a configuration in which the specific component of the gas within the storage room 2 is nitrogen and the concentration of nitrogen is measured by the concentration measurement device S1. In this case, the condition that the nitrogen concentration measured by the concentration measurement device S1 is above the reference concentration corresponds to the condition that the concentration of the specific component of the gas within the storage room 2 that is measured by the concentration measurement device S1 is outside the reference state.

Further, the specific component of the gas within the storage room 2 may be a component other than oxygen or nitrogen, including, for example, carbon dioxide and water vapor.

The invention claimed is:

1. An inactive gas supply facility comprising:
a storage section that stores a container;
an inactive gas supply portion that supplies an inactive gas to an interior of the container stored in the storage section;
a first control device configured to control the inactive gas supply portion; and
a second control device operatively connected to the first control device and configured to output, to the first control device, an operation instruction in which a state of supply of the inactive gas is defined,
wherein the operation instruction is an instruction of a target flow rate,
wherein the first control device includes a state determination portion that determines that the second control device has become unable to output the operation instruction, a condition determination portion that determines whether a predetermined stop condition is satisfied, and a processing execution portion that executes processing for controlling an operation of the inactive gas supply portion,
wherein the processing execution portion executes, if it is determined by the state determination portion that the second control device has become unable to output the operation instruction, continued operation processing for operating the inactive gas supply portion based on the operation instruction that was last output by the second control device, and
wherein the processing execution portion further executes, if it is determined during execution of the continued operation processing by the condition determination portion that the stop condition is satisfied, operation stop processing for stopping the inactive gas supply portion by suspending the continued operation processing.

2. The inactive gas supply facility according to claim 1, wherein
a plurality of the storage sections are provided,
each of the plurality of storage sections is separately provided with the inactive gas supply portion,
the second control device outputs the operation instruction for each of the plurality of inactive gas supply portions, and
the first control device separately controls each of the plurality of inactive gas supply portions based on the corresponding operation instructions for the inactive gas supply portions.

3. The inactive gas supply facility according to claim 1, wherein
the storage section is provided in an interior of a storage room that is partitioned from the outside,
the first control device is communicatively connected to a concentration measurement device that measures a concentration of a specific component of a gas within the storage room, and
the stop condition is that the concentration measured by the concentration measurement device is outside a reference state.

4. The inactive gas supply facility according to claim 1, wherein
the storage section is provided with a load-presence state detection device that detects a load-present state in which the container is stored and a load-absent state in which the container is not stored,
the first control device is communicatively connected to the load-presence state detection device, and
the stop condition is that the load-absent state is detected by the load-presence state detection device.

5. The inactive gas supply facility according to claim 1, wherein
the first control device includes a self failure diagnosis function of determining its own failure, and
the stop condition is that the first control device has determined its own failure by the self failure diagnosis function.

6. The inactive gas supply facility according to claim 1, wherein
the inactive gas supply portion is a flow rate regulation device that regulates a flow rate of the inactive gas supplied to the container stored in the storage section,
the inactive gas supply facility further comprises:
an intermediate control device that controls the flow rate regulation device by outputting a flow rate control instruction to the flow rate regulation device; and
a higher-level control device that outputs a higher-level instruction to the intermediate control device,
the higher-level control device includes a monitoring portion that monitors an operating state of the flow rate regulation device and an instruction output portion that outputs the higher-level instruction to the intermediate control device based on the operating state of the flow rate regulation device that is monitored by the monitoring portion,
the first control device is the intermediate control device,
the second control device is the higher-level control device, and
the operation instruction is the higher-level instruction.

7. The inactive gas supply facility according to claim 1, wherein
the inactive gas supply portion is a flow rate regulation device that regulates a flow rate of the inactive gas supplied to the container stored in the storage section, the inactive gas supply facility further comprises:
an intermediate control device that controls the flow rate regulation device by outputting a flow rate control instruction to the flow rate regulation device; and
a higher-level control device that outputs a higher-level instruction to the intermediate control device,
the higher-level control device includes a monitoring portion that monitors an operating state of the flow rate regulation device, and an instruction output portion that outputs the higher-level instruction to the intermediate control device based on the operating state of the flow rate regulation device that is monitored by the monitoring portion,
the first control device is the flow rate regulation device,
the second control device is the intermediate control device, and
the operation instruction is the flow rate control instruction.

8. An inactive gas supply method using an inactive gas supply facility,
the inactive gas supply facility comprising:
a storage section that stores a container;
an inactive gas supply portion that supplies an inactive gas to an interior of the container stored in the storage section;
a first control device that controls the inactive gas supply portion; and
a second control device that outputs, to the first control device, an operation instruction in which a state of supply of the inactive gas is defined,
the inactive gas supply method comprising the steps performed by the first control device, the steps comprising:
a state determination step of determining that the second control device has become unable to output the operation instruction;
a condition determination step of determining whether a predetermined stop condition is satisfied; and
a processing execution step of executing processing for controlling an operation of the inactive gas supply portion,
wherein, in the processing execution step, if it is determined by the state determination step that the second control device has become unable to output the operation instruction, continued operation processing for operating the inactive gas supply portion based on the operation instruction that was last output by the second control device is executed, and,
in the processing execution step, if it is determined during execution of the continued operation processing in the condition determination step that the stop condition is satisfied, operation stop processing for stopping the inactive gas supply portion by suspending the continued operation processing is further executed.

9. The inactive gas supply method according to claim 8, wherein
a plurality of the storage sections are provided,
each of the plurality of storage sections is separately provided with the inactive gas supply portion,
the second control device outputs the operation instruction for each of the plurality of inactive gas supply portions, and,
in the processing execution step, each of the plurality of inactive gas supply portions is separately controlled based on the corresponding operation instructions for the inactive gas supply portions.

10. The inactive gas supply method according to claim 8, wherein
the storage section is provided in an interior of a storage room that is partitioned from the outside,
the first control device is communicatively connected to a concentration measurement device that measures a concentration of a specific component of a gas within the storage room, and
the stop condition is that the concentration measured by the concentration measurement device is outside a reference state.

11. The inactive gas supply method according to claim 8, wherein
the storage section is provided with a load-presence state detection device that detects a load-present state in which the container is stored and a load-absent state in which the container is not stored,
the first control device is communicatively connected to the load-presence state detection device, and
the stop condition is that the load-absent state is detected by the load-presence state detection device.

12. The inactive gas supply method according to claim 8, wherein
the first control device includes a self failure diagnosis function of determining its own failure, and
the stop condition is that the first control device has determined its own failure by the self failure diagnosis function.

13. The inactive gas supply method according to claim 8, wherein
the inactive gas supply portion is a flow rate regulation device that regulates a flow rate of the inactive gas supplied to the container stored in the storage section,
the inactive gas supply facility further comprises:
an intermediate control device that controls the flow rate regulation device by outputting a flow rate control instruction to the flow rate regulation device; and
a higher-level control device that outputs a higher-level instruction to the intermediate control device,
the higher-level control device includes a monitoring portion that monitors an operating state of the flow rate regulation device and an instruction output portion that outputs the higher-level instruction to the intermediate control device based on the operating state of the flow rate regulation device that is monitored by the monitoring portion,
the first control device is the intermediate control device,
the second control device is the higher-level control device, and
the operation instruction is the higher-level instruction.

14. The inactive gas supply method according to claim 8, wherein
the inactive gas supply portion is a flow rate regulation device that regulates a flow rate of the inactive gas supplied to the container stored in the storage section,
the inactive gas supply facility further comprises:
an intermediate control device that controls the flow rate regulation device by outputting a flow rate control instruction to the flow rate regulation device; and
a higher-level control device that outputs a higher-level instruction to the intermediate control device,
the higher-level control device includes a monitoring portion that monitors an operating state of the flow rate regulation device, and an instruction output portion that outputs the higher-level instruction to the intermediate control device based on the operating state of the flow rate regulation device that is monitored by the monitoring portion, the first control device is the flow rate regulation device, the second control device is the intermediate control device, and the operation instruction is the flow rate control instruction.

15. The inactive gas supply facility according to claim 1, wherein the second control device generates the operation instruction based on a purge pattern in which a target flow rate and a supply period are defined.

* * * * *